(12) United States Patent
Quli et al.

(10) Patent No.: US 11,749,544 B2
(45) Date of Patent: Sep. 5, 2023

(54) PROCESS TEMPERATURE MEASUREMENT DEVICE FABRICATION TECHNIQUES AND METHODS OF CALIBRATION AND DATA INTERPOLATION OF THE SAME

(71) Applicant: KLA Corporation, Milpitas, CA (US)

(72) Inventors: Farhat A. Quli, Castro Valley, CA (US); Andrew Nguyen, San Jose, CA (US); James Richard Bella, San Jose, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/729,469

(22) Filed: Apr. 26, 2022

(65) Prior Publication Data

US 2022/0399216 A1    Dec. 15, 2022

Related U.S. Application Data

(63) Continuation of application No. 16/558,471, filed on Sep. 3, 2019, now Pat. No. 11,315,811.
(Continued)

(51) Int. Cl.
| | |
|---|---|
| *H01L 21/67* | (2006.01) |
| *H05K 1/18* | (2006.01) |
| *H05K 1/02* | (2006.01) |

(52) U.S. Cl.
CPC .. *H01L 21/67253* (2013.01); *H01L 21/67248* (2013.01); *H05K 1/023* (2013.01); *H05K 1/181* (2013.01); *H05K 2201/10151* (2013.01)

(58) Field of Classification Search
None
See application file for complete search history.

(56) References Cited

U.S. PATENT DOCUMENTS

| | | |
|---|---|---|
| 7,540,188 B2 | 6/2009 | Wiese et al. |
| 10,460,966 B2 | 10/2019 | Sun et al. |
| (Continued) | | |

FOREIGN PATENT DOCUMENTS

| | | |
|---|---|---|
| KR | 20170129602 A | 11/2017 |
| TW | I470716 B | 1/2015 |
| TW | 201614752 A | 4/2016 |

OTHER PUBLICATIONS

International Search Report and Written Opinion dated Dec. 20, 2019 for PCT/US2019/049833.
(Continued)

*Primary Examiner* — Khaja Ahmad
(74) *Attorney, Agent, or Firm* — Suiter Swantz pc llo

(57) ABSTRACT

A process condition measurement wafer assembly is disclosed. In embodiments, the process condition measurement wafer assembly includes a bottom substrate and a top substrate. In another embodiment, the process condition measurement wafer assembly includes one or more electronic components disposed on one or more printed circuit elements and interposed between the top substrate and bottom substrate. In another embodiment, the process condition measurement wafer assembly includes one or more shielding layers formed between the bottom substrate and the top substrate. In embodiments, the one or more shielding layers are configured to electromagnetically shield the one or more electronic components and diffuse voltage potentials across the bottom substrate and the top substrate.

18 Claims, 13 Drawing Sheets

Related U.S. Application Data

(60) Provisional application No. 62/727,633, filed on Sep. 6, 2018.

(56) References Cited

U.S. PATENT DOCUMENTS

| | | |
|---|---|---|
| 2004/0154417 A1 | 8/2004 | Renken et al. |
| 2007/0251339 A1 | 11/2007 | Wiese et al. |
| 2007/0255509 A1 | 11/2007 | LeFebvre et al. |
| 2009/0056441 A1* | 3/2009 | Sun .................... G03F 7/70616 73/431 |
| 2012/0269229 A1 | 10/2012 | Ishida et al. |
| 2014/0355643 A1* | 12/2014 | Sharratt ................ G01K 19/00 374/163 |
| 2016/0131550 A1 | 5/2016 | Besling et al. |
| 2016/0172309 A1 | 6/2016 | Gong et al. |
| 2017/0021943 A1 | 1/2017 | Peverill et al. |
| 2017/0219437 A1 | 8/2017 | Sun et al. |
| 2017/0358540 A1 | 12/2017 | Min et al. |
| 2017/0365495 A1 | 12/2017 | Sun et al. |

OTHER PUBLICATIONS

Taiwan Office Action dated Jun. 12, 2023 for TW Patent Application No. 108132252, 9 pages (including translation).

* cited by examiner

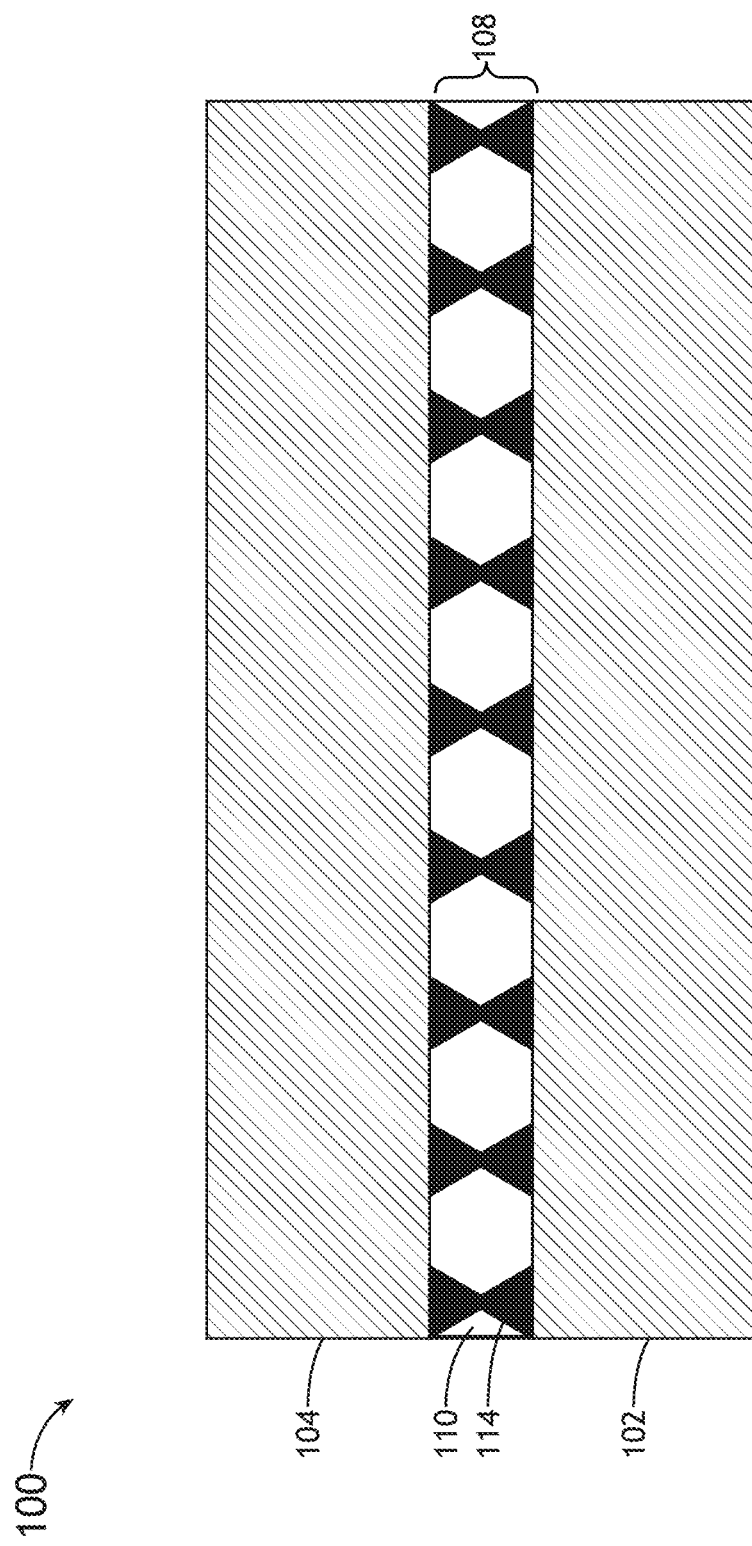

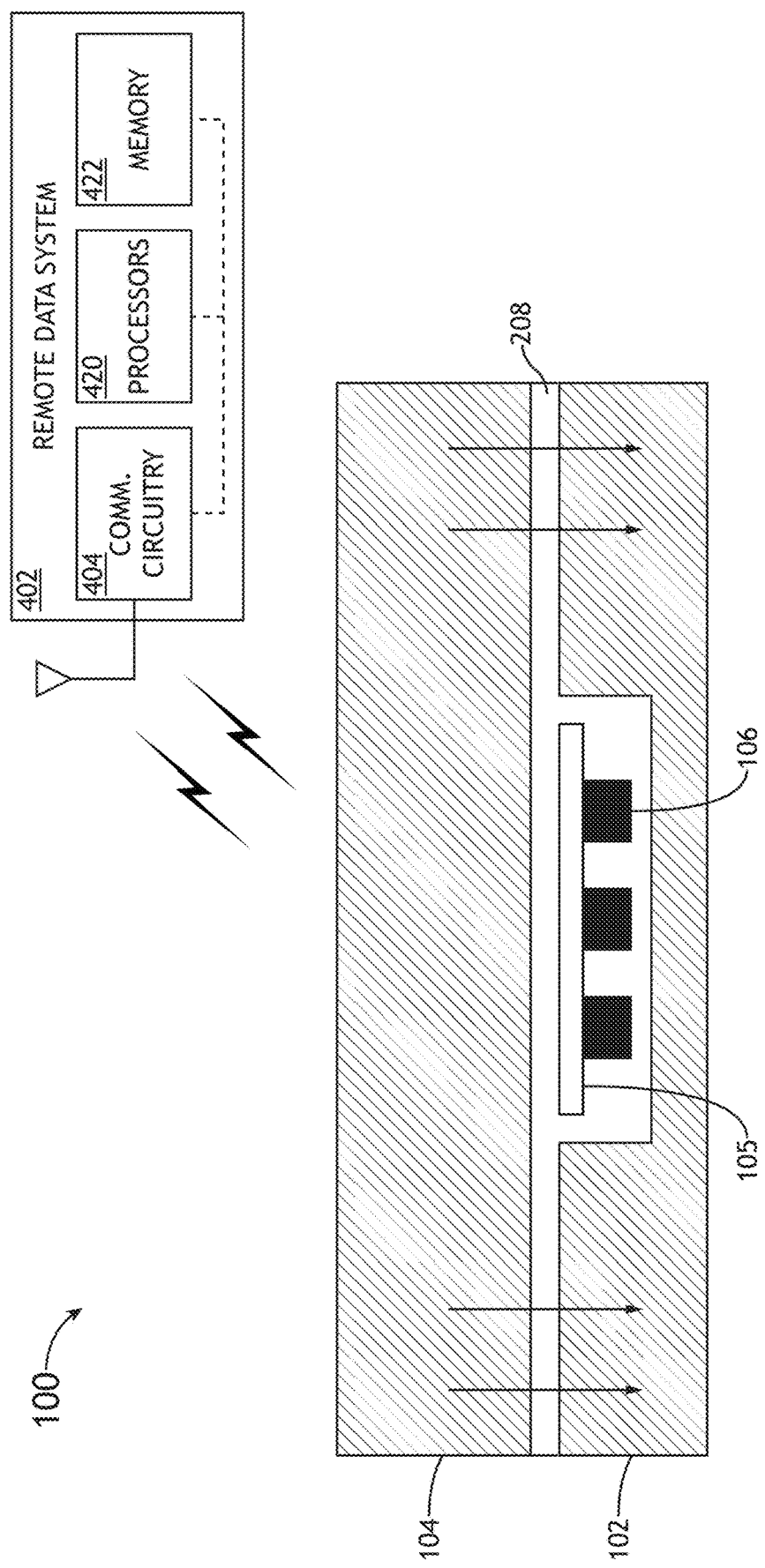

PROCESS TEMPERATURE MEASUREMENT DEVICE FABRICATION TECHNIQUES AND METHODS OF CALIBRATION AND DATA INTERPOLATION OF THE SAME

CROSS-REFERENCE TO RELATED APPLICATION

The present application claims priority under 35 U.S.C. § 120 to U.S. patent application Ser. No. 16/558,471 entitled PROCESS TEMPERATURE MEASUREMENT DEVICE FABRICATION TECHNIQUES AND METHODS OF CALIBRATION AND DATA INTERPOLATION OF THE SAME, filed Sep. 3, 2019, naming Farhat A. Quli, Andrew Nguyen, and James Richard Bella as inventors, which claims priority under 35 U.S.C. § 119(e) to United States Provisional Patent Application Ser. No. 62/727,633 entitled PROCESS TEMPERATURE MEASUREMENT DEVICE FABRICATION TECHNIQUES AND METHODS OF CALIBRATION AND DATA INTERPOLATION OF THE SAME, filed Sep. 6, 2018, naming Farhat A. Quli, Andrew Nguyen, and James Richard Bella as inventors, whereby each of the applications is incorporated herein by reference in the entirety.

TECHNICAL FIELD

The present invention generally relates to monitoring of wafers along a semiconductor process line, and, in particular, to a system and method for a process condition measurement wafer assembly.

BACKGROUND

As tolerances on process conditions in semiconductor device processing environments continue to narrow, the demand for improved process monitoring systems continues to increase. Thermal uniformity within a processing system is one such condition. Current methods are unable to monitor temperature under the extreme conditions (e.g., high temperature) required of current processing techniques without contaminating the associated chamber. One previous approach to monitoring process conditions involves the use of a process condition measurement wafer. Conventional process condition measurement wafers may include wireless data acquisition systems which measure and record process conditions, such as temperature. However, conventional process condition measurement wafers are often subject to temperature inaccuracies attributable to internal construction variation, and may not be able to withstand the energy flux of current and future processing systems (e.g., epitaxy chambers, plasma etch chambers). Therefore, it would be desirable to provide a system and method to allow for high temperature measurement using an instrumented wafer to monitor the conditions of a semiconductor device processing line.

SUMMARY

A process condition measurement wafer assembly is disclosed. In embodiments, the process condition measurement wafer assembly includes a bottom substrate and a top substrate. In another embodiment, the process condition measurement wafer assembly includes one or more electronic components disposed on one or more printed circuit elements and interposed between the top substrate and bottom substrate. In another embodiment, the process condition measurement wafer assembly includes one or more shielding layers formed between the bottom substrate and the top substrate. In embodiments, the one or more shielding layers are configured to electromagnetically shield the one or more electronic components and diffuse voltage potentials across the bottom substrate and the top substrate.

A process condition measurement wafer assembly is disclosed. In embodiments, the process condition measurement wafer assembly includes a bottom substrate and a top substrate. In another embodiment, the process condition measurement wafer assembly includes one or more electronic components disposed on one or more printed circuit elements and interposed between the top substrate and the bottom substrate. In another embodiment, at least one of the bottom substrate or the top substrate are configured to electromagnetically shield the one or more electronic components and diffuse voltage potentials across the bottom substrate and the top substrate.

A method is disclosed. In embodiments, the method may include: acquiring, under isothermal conditions, a set of temperature measurements from a set of temperature sensors and a set of heat flux measurements from a set of heat flux sensors distributed across a process condition measurement wafer; calibrating the set of temperature measurements and the set of heat flux measurements acquired under isothermal conditions; applying a known heat flux to the process condition measurement wafer; acquiring, during application of the known heat flux, an additional set of temperature measurements from the set of temperature sensors and an additional set of heat flux measurements from the set of heat flux sensors; identifying temperature variation observed across the set of temperature sensors during application of the known heat flux; identifying a heat flux-temperature variation relationship by correlating the known heat flux with the identified temperature variation of the set of temperature sensors; acquiring, under unknown heat flux conditions, a test set of temperature measurements from the set of temperature sensors and a test set of heat flux measurements from the heat flux sensors; and adjusting the test set of temperature measurements based on the test set of heat flux measurements and the identified heat flux-temperature variation relationship.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which:

FIG. 1D is a simplified cross-sectional view of a portion of a process condition measurement wafer assembly, in accordance with one or more embodiments of the present disclosure.

FIG. 4A is a simplified cross-sectional view of a process condition measurement wafer assembly communicatively coupled to a remote data system, in accordance with one or more embodiments of the present disclosure.

DETAILED DESCRIPTION OF THE INVENTION

Figure 1A:
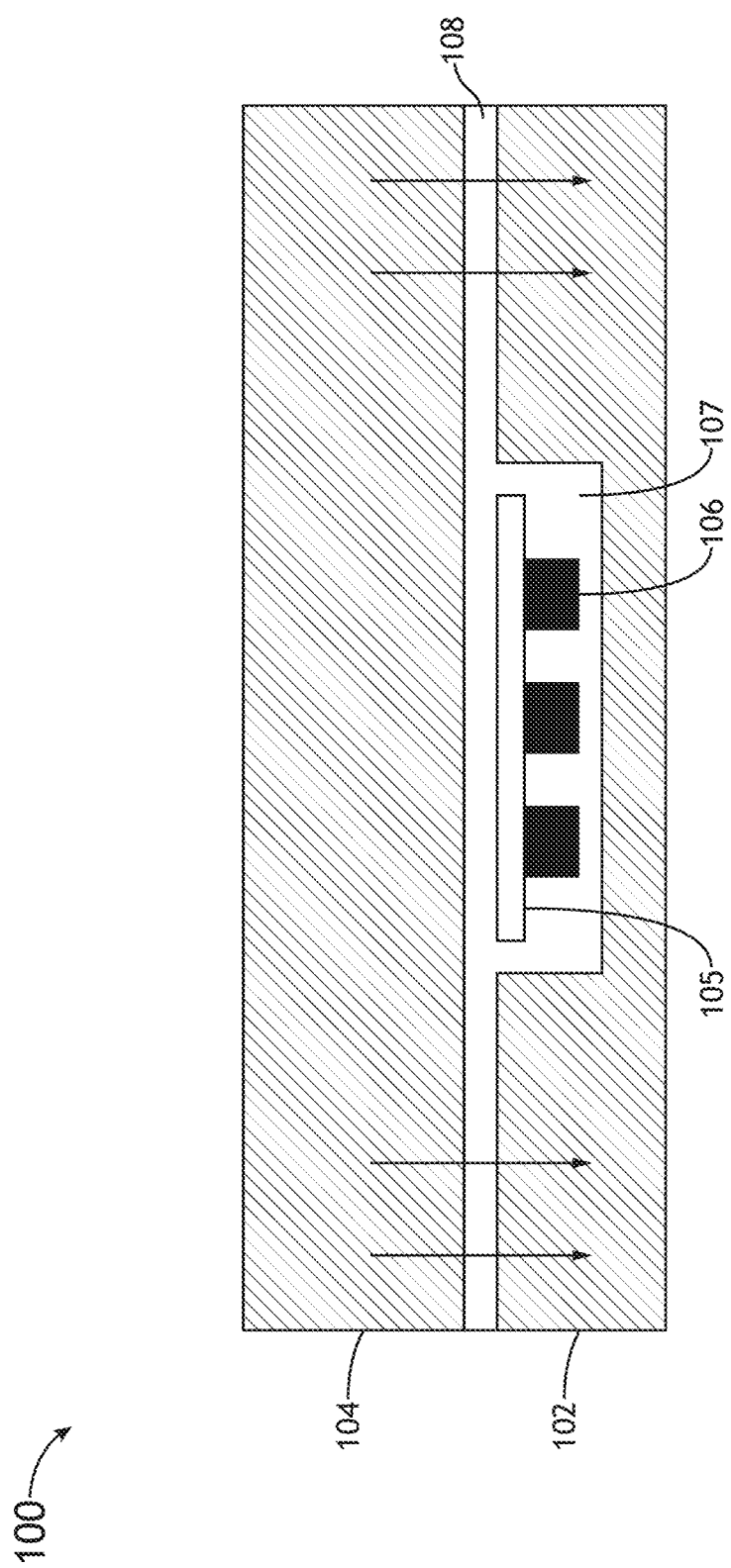
FIG. 1A is a simplified cross-sectional view of a process condition measurement wafer assembly, in accordance with one or more embodiments of the present disclosure.

Reference will now be made in detail to the subject matter disclosed, which is illustrated in the accompanying drawings.

Referring generally to FIGS. 1A through 6, a system and method for a process condition measurement wafer assembly is shown and described, in accordance with one or more embodiments of the present disclosure.

Conventional process condition measurement wafers include measurement electronics disposed between silicon wafers. The silicon wafers are designed to shield the measurement electronics from extreme conditions (e.g., high RF, high heat flux, high electromagnetic radiation) within process chambers. The silicon wafers within these conventional process condition measurement wafers are typically coupled via one or more discrete ohmic contacts between the respective silicon wafers. However, these ohmic contacts result in high current density within and around the contacts, and may result in high potentials across the process condition measurement wafers. Additionally, complex internal construction of conventional process condition measurement wafers may further result in temperature inaccuracies due to the internal construction of the wafers themselves.

Accordingly, embodiments of the present disclosure are directed to a system and method which cure one or more of the shortfalls of the previous approaches identified above. Embodiments of the present disclosure are directed to a process condition measurement wafer assembly which improves the accuracy, precision, and construction of wafer-based process condition measurement devices. Additional embodiments of the present disclosure are directed to a process condition measurement wafer assembly including one or more electromagnetic shielding layers disposed between a top substrate and a bottom substrate. Further embodiments of the present disclosure are directed to a process condition measurement wafer assembly including one or more thermal pillars configured to facilitate heat transfer throughout the apparatus.

Embodiments of the present disclosure are directed to a process condition measurement wafer assembly capable of operating up to high temperature (e.g., 600° C. to 800° C.). Such a process condition measurement wafer assembly may be utilized with semiconductor processing chambers (e.g., epitaxy chamber, plasma etch chamber) operating at high temperatures. In some embodiments, the process condition measurement wafer assembly of the present disclosure includes a top substrate, a bottom substrate, and one or more shielding layers, whereby the on-board electronic components (e.g., sensors, processors, memory, power supply) and/or other sensitive devices are interposed between the top substrate and the bottom substrate, and shielded by the one or more shielding layers. The use of an instrumented substrate is described in U.S. patent application Ser. No. 15/277,753, filed on Sep. 27, 2016, which is incorporated herein by reference in the entirety. Instrumented substrates are described in further detail in U.S. Pat. No. 7,540,188 B2, filed May 1, 2016 entitled PROCESS CONDITION MEASURING DEVICE WITH SHIELDING, and in U.S. patent application Ser. No. 15/277,792, filed Sep. 27, 2016 entitled ENCAPSULATED INSTRUMENTED SUBSTRATE APPARATUS FOR ACQUIRING MEASUREMENT PARAMETERS IN HIGH TEMPERATURE PROCESS APPLICATIONS, both of which are incorporated herein by reference in the entirety.

FIG. 1A is a simplified cross-sectional view of a process condition measurement wafer assembly 100, in accordance with one or more embodiments of the present disclosure. The process condition measurement wafer assembly 100 may include, but is not limited to, a top substrate 104 and a bottom substrate 102. The process condition measurement wafer assembly 100 may include one or more electronic components 106.

As shown in FIG. 1A, the top substrate 104 may be mechanically coupled to the bottom substrate 102. The top substrate 104 and/or the bottom substrate 102 of the process condition measurement wafer assembly 100 may include any substrate known in the art. In some embodiments, the top substrate 104 and/or the bottom substrate 102 of the process condition measurement wafer assembly 100 may include a wafer. For example, the top substrate 104 and/or the bottom substrate 102 may include, but are not limited to, a semiconductor substrate, a glass wafer (e.g., fused silica glass wafer, borosilicate glass wafer), a crystalline wafer (e.g., crystalline quartz wafer, silicon wafer), a wafer formed from one or more compounds (e.g., silicon carbide, silicon nitride), and the like. For instance, the process condition measurement wafer assembly 100 may include any substrate causing negligible contamination in a semiconductor processing environment, such as, but not limited to, a wafer formed from one or more of silicon, silicon carbide, silicon nitride, gallium nitride, gallium arsenide, germanium, gallium, indium, or silicon dioxide (e.g., quartz).

In one embodiment, the process condition measurement wafer assembly 100 may include one or more cavities 107 between the top substrate 104 and the bottom substrate 102.

For example, as shown in FIG. 1A, the process condition measurement wafer assembly 100 may include a cavity 107 within the bottom substrate 102. It is noted herein that the process condition measurement wafer assembly 100 may include one or more cavities 107 within the top substrate 104 and/or the bottom substrate 102. For example, a cavity 107 may include a portion of a cavity 107 within the top substrate 104, and a portion of a cavity 107 within the bottom substrate 102.

In another embodiment, the one or more electronic components 106 may be interposed between the top substrate 104 and the bottom substrate 102. For example, as shown in FIG. 1A, the one or more electronic components 106 may be disposed within the one or more cavities 107. In embodiments, the one or more electronic components 106 are disposed between the top substrate 104 and the bottom substrate 102 such that the one or more electronic components 106 are sealed (e.g., hermetically sealed) between the top substrate 104 and the bottom substrate 102. The one or more electronic components 106 may include any electronic components which are configured to monitor process conditions within a process system (e.g., epitaxy chamber, plasma etch chamber). In this regard, the one or more electronic components 106 may include any electronic components known in the art including, but not limited to, sensor devices (e.g., temperature sensors, pressure sensors, chemical sensors, radiation sensors, heat flux sensors, voltage sensors), a power source, one or more processors, a memory, communication circuitry, and the like.

In some embodiments, a plurality of electronic components 106 may be communicatively coupled to one another within the process condition measurement wafer assembly 100. In another embodiment, the one or more electronic components 106 may be disposed on one or more printed circuit elements 105 interposed between the top substrate 104 and the bottom substrate 102. In this regard, the one or more electronic components 106 may be communicatively coupled via the one or more printed circuit elements 105. The one or more printed circuit elements 105 may include any electronic components known in the art including, but not limited to, a printed circuit board, a printed wiring board, and the like. Similarly, the one or more printed circuit elements 105 may be formed from any material known in the art including, but not limited to, a ceramic, silicon, an inorganic material, and the like.

Figure 1B:
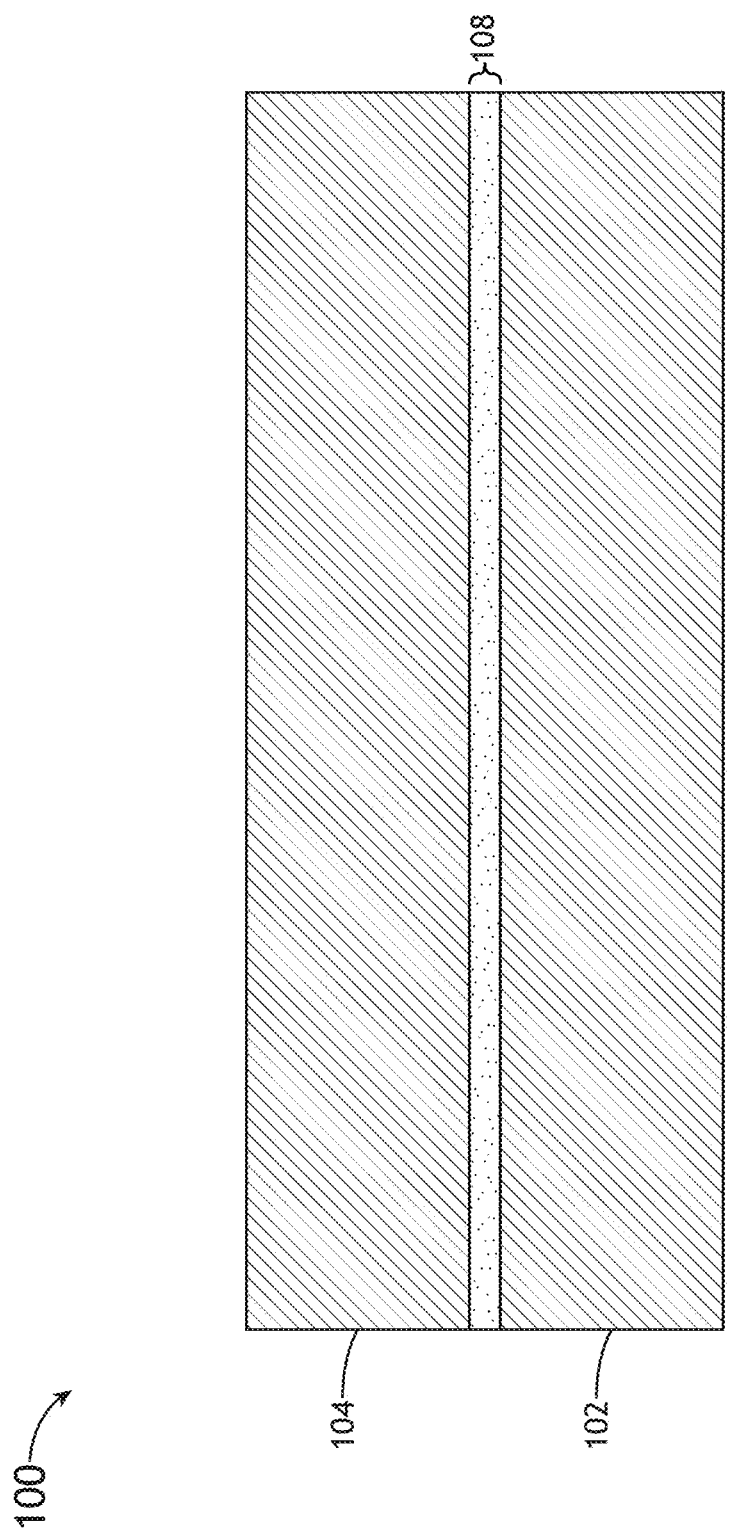
FIG. 1B is a simplified cross-sectional view of a portion of a process condition measurement wafer assembly, in accordance with one or more embodiments of the present disclosure.

FIG. 1B is a simplified cross-sectional view of a portion of a process condition measurement wafer assembly 100, in accordance with one or more embodiments of the present disclosure.

As noted previously herein, the top substrate 104 and the bottom substrate 102 may be mechanically coupled to one another. In some embodiments, the process condition measurement wafer assembly 100 may further include one or more shielding layers 108. The one or more shielding layers 108 may be formed between the top substrate 104 and the bottom substrate 102. For example, the one or more shielding layers 108 may include one or more films disposed/deposited on a surface of the top substrate 104 and/or bottom substrate 102. For instance, as shown in FIG. 1B, the one or more shielding layers 108 may be disposed across at least a portion of an upper surface of the bottom substrate 102 and/or across at least a portion of a lower surface of the top substrate 104.

It is contemplated herein that the one or more shielding layers 108 may include any layers/films known in the art configured to electromagnetically shield the one or more electronic components 106 and/or diffuse voltage potentials across the top substrate 104 and/or bottom substrate 102. In some embodiments, the one or more shielding layers 108 may be formed from an electrically conductive material. In additional and/or alternative embodiments, the one or more shielding layers 108 may include a light-blocking film. In this regard, the one or more shielding layers 108 may include one or more opaque films. For example, the one or more shielding layers 108 may include, but is not limited to, a material that is absorptive of radiation traversing the top substrate 104 to the bottom substrate 102.

The one or more shielding layers 108 may be further understood with reference to FIGS. 1C-1F.

Figure 1C:
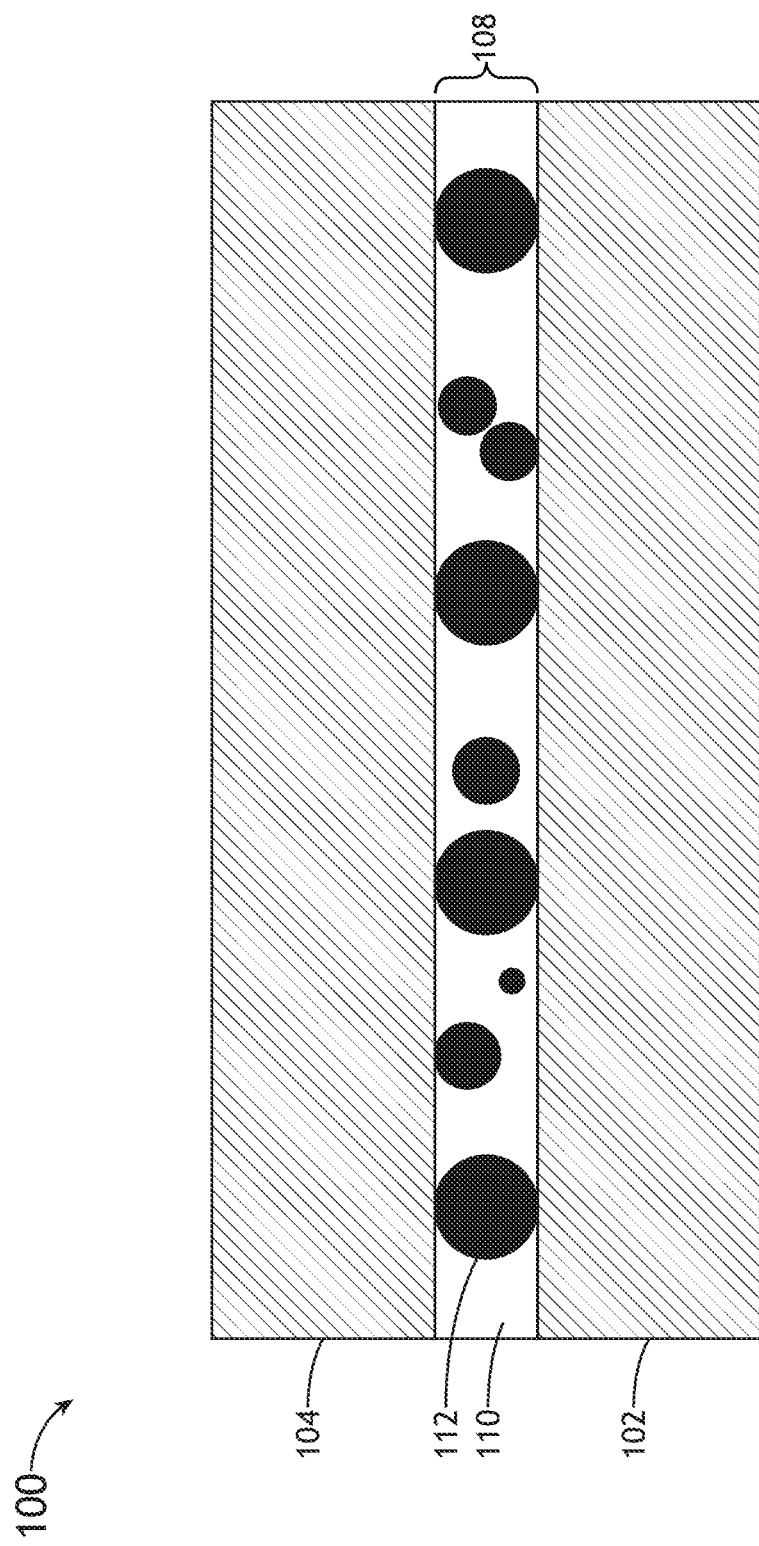
FIG. 1C is a simplified cross-sectional view of a portion of a process condition measurement wafer assembly, in accordance with one or more embodiments of the present disclosure.

FIG. 1C is a simplified cross-sectional view of a portion of a process condition measurement wafer assembly 100, in accordance with one or more embodiments of the present disclosure. As shown in FIG. 1C, the one or more shielding layers 108 may include, but are not limited to, an adhesive layer 110 and a plurality of conductive particles 112.

In some embodiments, a shielding layer 108 formed between at least a portion of the top substrate 104 and the bottom substrate 102 may include an adhesive layer 110. The adhesive layer 110 may be formed from any adhesive material known in the art configured to mechanically couple substrates. In another embodiment, the shielding layer 108 may include conductive particles 112 suspended within the adhesive layer 110. For example, as shown in FIG. 1C, the shielding layer 108 may include a plurality of conductive particles 112 suspended within an adhesive layer 110. In some embodiments, the conductive particles 112 may be distributed evenly throughout the adhesive layer 110. In embodiments, the inclusion of conductive particles 112 within the shielding layer 108 may create electrical contact between at least a portion of the top substrate 104 and at least a portion of the bottom substrate 102. Accordingly, the conductive particles 112 may be formed using any conductive material known in the art. Similarly, the adhesive layer 110 may be formed from an electrically conductive material in order to further facilitate electrical contact between the top substrate 104 and the bottom substrate 102.

It is contemplated herein that the inclusion of conductive particles 112 within the shielding layer 108 may create electrical contact between the top substrate 104 and the bottom substrate 102, and/or between conductive layers deposited on these respective substrates. These electrical contacts may facilitate the diffusion of voltage potentials throughout the process condition measurement wafer assembly 100 and/or between the top substrate 104 and the bottom substrate 102. Furthermore, these electrical contacts and conductive particles/layers may provide electrical and electromagnetic shielding to the electronic components 106 of the process condition measurement wafer assembly 100.

FIG. 1D is a simplified cross-sectional view of a portion of a process condition measurement wafer assembly 100, in accordance with one or more embodiments of the present disclosure. As shown in FIG. 1D, the one or more shielding layers 108 may include, but are not limited to, an adhesive layer 110 and a plurality of electrically conductive structures 114.

In additional and/or alternative embodiments, electrical contact between portions of the top substrate 104 and the bottom substrate 102 may be facilitated by the use of electrically conductive structures 114. For example, as shown in FIG. 1D, a plurality of electrically conductive structures 114 may be fabricated on a surface of at least one of the top substrate 104 or bottom substrate 102 such that the electrically conductive structures 114 electrically couple at least a portion of the top substrate 104 and at least a portion of the bottom substrate 102. The plurality of electrically conductive structures 114 may include any shape or type of electrically conductive structures known in the art. For example, the plurality of electrically conductive structures 114 may include a plurality of protrusions formed on a surface of at least one of the top substrate 104 or the bottom substrate 102. By way of another example, the plurality of electrically conductive structures 114 may include a plurality of conic sections (e.g., cones) and/or bumps formed on a surface of the top substrate 104 and/or a surface of the bottom substrate 102. The plurality of electrically conductive structures 114 may be formed using any material known in the art including, but not limited to, one or more conductive metals.

The plurality of electrically conductive structures 114 may be formed/fabricated on a surface of the top substrate 104 and/or bottom substrate 102 using any technique known in the art. For example, the electrically conductive structures 114 may be deposited onto a surface of the top substrate 104 and/or bottom substrate 102 through an electroplating process or a wire bond bumping process. In another embodiment, the adhesive layer 110 may be formed around the plurality of electrically conductive structures 114.

Figure 1E:
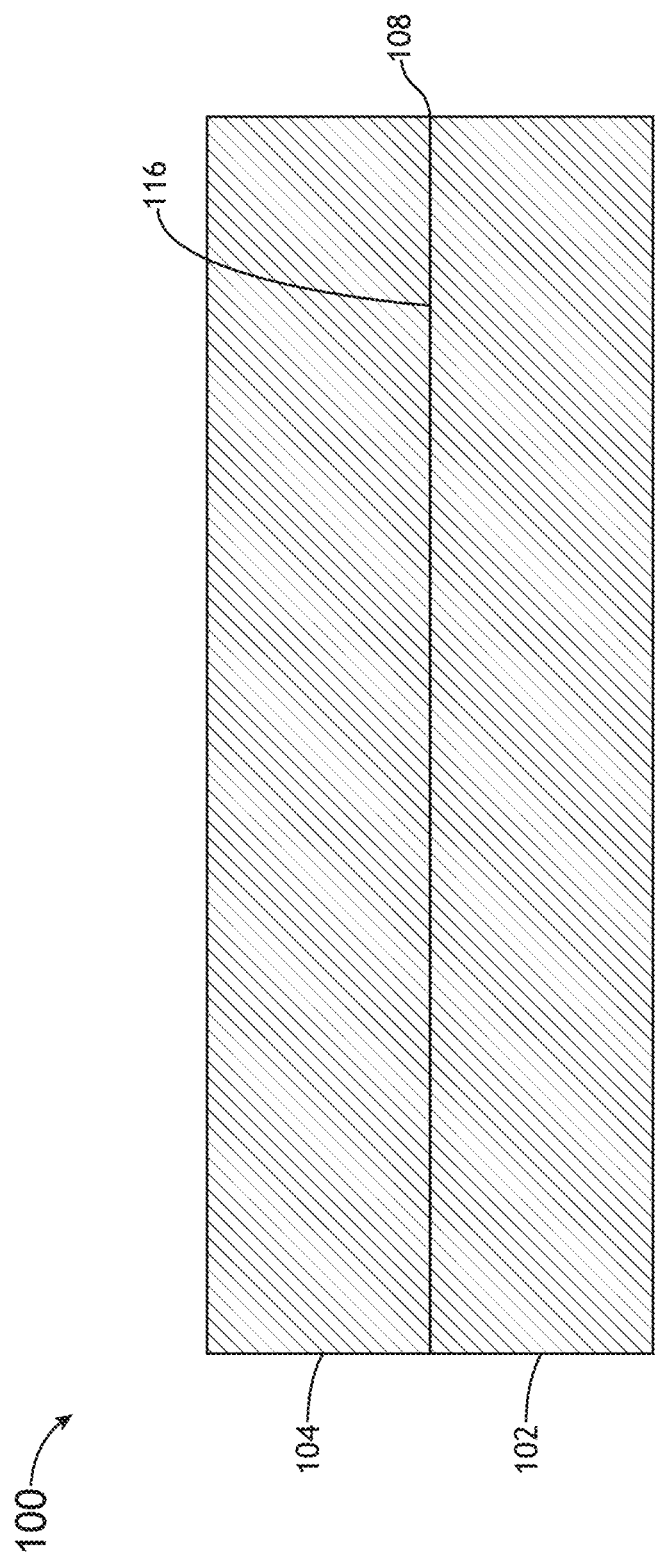
FIG. 1E is a simplified cross-sectional view of a portion of a process condition measurement wafer assembly, in accordance with one or more embodiments of the present disclosure.

FIG. 1E is a simplified cross-sectional view of a portion of a process condition measurement wafer assembly 100, in accordance with one or more embodiments of the present disclosure.

In one embodiment, the one or more shielding layers 108 are formed via direct wafer-to-wafer bonding. For example, as shown in FIG. 1E, the one or more shielding layers 108 may be formed via an adhesive-less silicon-to-silicon bonding between the top substrate 104 and the bottom substrate 102. In some embodiments, the top substrate 104 and/or the bottom substrate 102 may serve as the one or more shielding layers 108. Thus, the top substrate 104 and/or the bottom substrate 102 may be configured as the one or more shielding layers 108. In this regard, the top substrate 104 and/or the bottom substrate 102 may serve to electromagnetically shield the one or more electronic components 106 and diffuse voltage potentials in addition to, or in lieu of, the one or more shielding layers 108. For example, as shown in FIG. 1E, the top substrate 104 direct bonded to the bottom substrate 102 may include a doped silicon substrate such that the top substrate 104 serves as a shielding layer 108.

It is contemplated herein that shielding layers 108 formed via direct wafer-to-wafer bonding (e.g., silicon-to-silicon bonding) may be carried out with one or more intermediate films 116 interposed between the top substrate 104 and the bottom substrate 102.

Figure 1F:
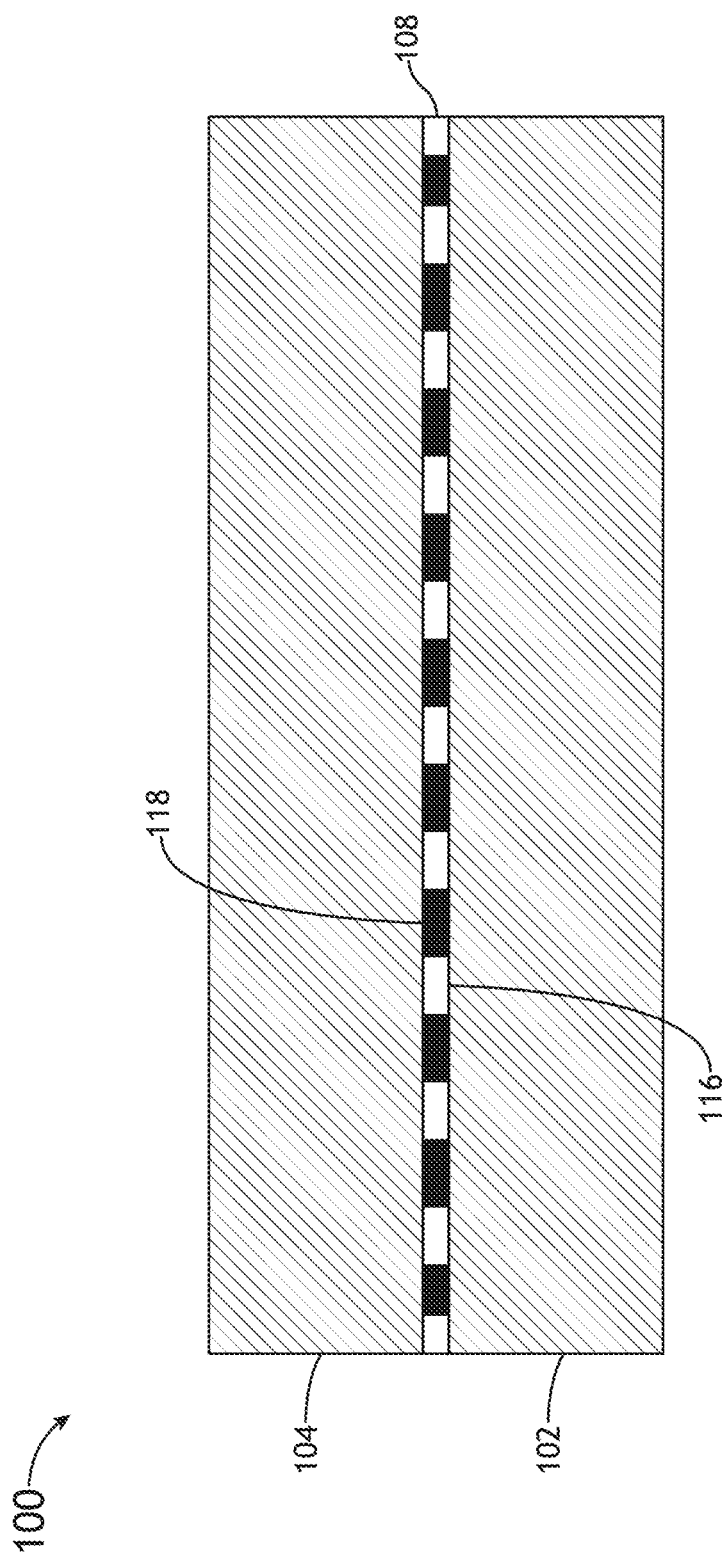
FIG. 1F is a simplified cross-sectional view of a portion of a process condition measurement wafer assembly, in accordance with one or more embodiments of the present disclosure.

In some embodiments, as shown in FIG. 1F, the one or more shielding layers 108 of the process condition measurement wafer assembly 100 include one or more intermediate films 116 and one or more metal contacts 118. It is contemplated herein that electrical coupling between the top substrate 104 and the bottom substrate 102 may be further facilitated with direct metal-to-metal thermo-compression bonding at discrete locations in order to improve conductivity. Accordingly, conductivity may be improved through the inclusion of one or more additional metal contacts 118 within the adhesive-less silicon-to-silicon bonding. For example, as shown in FIG. 1F, the one or more intermediate films 116 interposed between the top substrate 104 and the bottom substrate 102 may include a plurality of metal contacts 118. By way of another example, the one or more intermediate films 116 may include one or more metal film layers in order to improve electrical coupling between the top substrate 104 and the bottom substrate 102.

In additional and/or alternative embodiments, the one or more shielding layers 108 may include one or more films deposited on at least one of the top substrate 104 or the bottom substrate 102 via a transient liquid phase bonding process. For example, metal films deposited on a surface of the top substrate 104 and the bottom substrate 102 may react with one another to form an alloy in order to form the one or more shielding layers 108 and bond the top substrate 104 and bottom substrate 102.

Figure 2A:
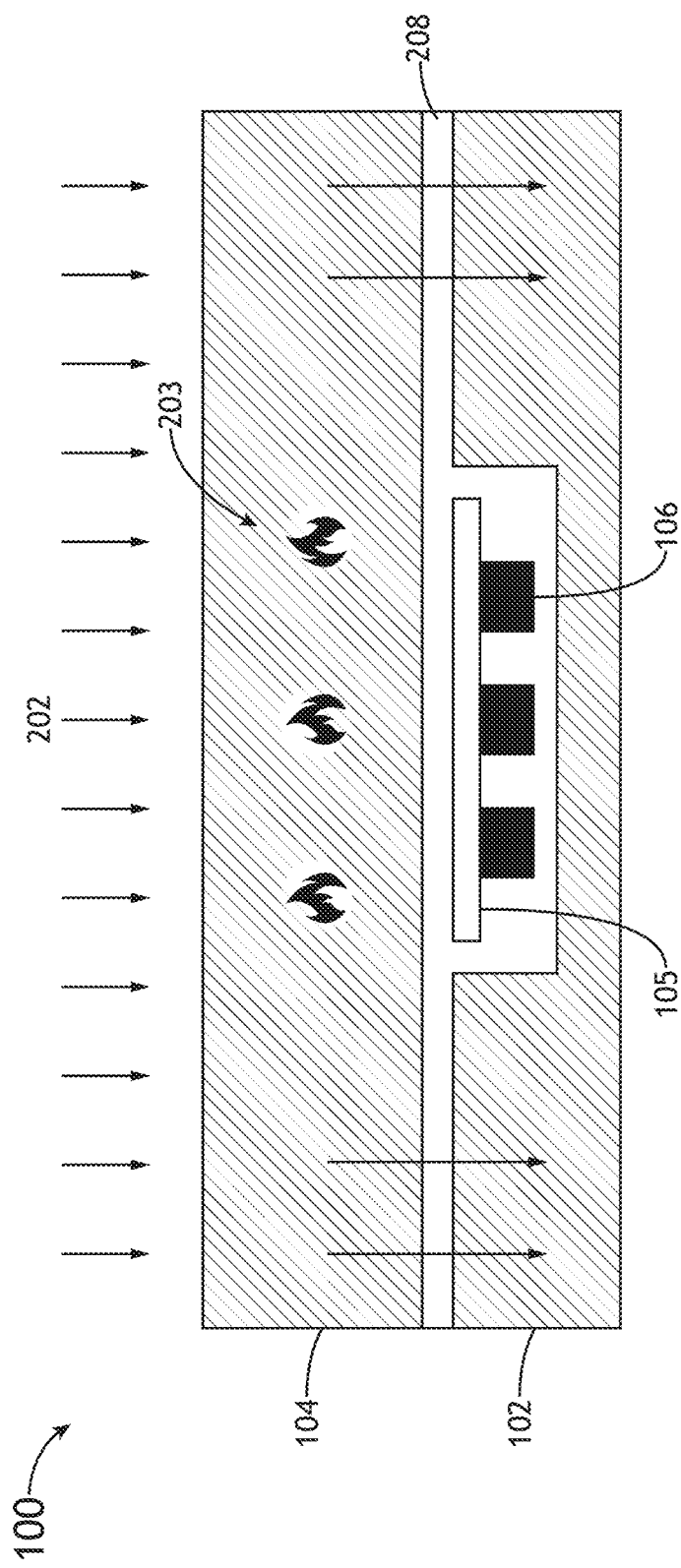
FIG. 2A is a simplified cross-sectional view of a process condition measurement wafer assembly, in accordance with one or more embodiments of the present disclosure.

FIG. 2A is a simplified cross-sectional view of a process condition measurement wafer assembly 100. The process condition measurement wafer assembly 100 may include, but is not limited to, a top substrate 104, a bottom substrate 102, one or more electronic components 106, one or more printed circuit elements 105, and one or more layers 208. It is noted herein that the one or more layers 208 may include one or more adhesive layers and/or one or more shielding layers 108 discussed previously herein with respect to FIGS. 1B-1F.

As noted previously herein, one issue associated with conventional process condition measurement wafers is poor thermal management and the build-up of heat, which may lead to the failure of electronic components, adhesive layers, or both. For example, as shown in FIG. 2A, a process condition measurement wafer assembly 100 may be exposed to a high heat flux 202. While efficient thermal conductivity pathways may exist between direct couplings of the top substrate 104 and the bottom substrate 102, thermal conductivity pathways may be substantially diminished in locations with electronic components 106 and/or printed circuit elements 105 interposed between the top substrate 104 and the bottom substrate 102. These diminished thermal conductivity pathways may therefore result in high-temperature areas 203 and the build-up of heat, as shown in FIG. 2A.

Accordingly, some embodiments of the present disclosure are directed to a process condition measurement wafer assembly 100 with improved thermal management construction in order to improve the thermal robustness of the process condition measurement wafer assembly 100. This may be further understood with reference to FIG. 2B.

Figure 2B:
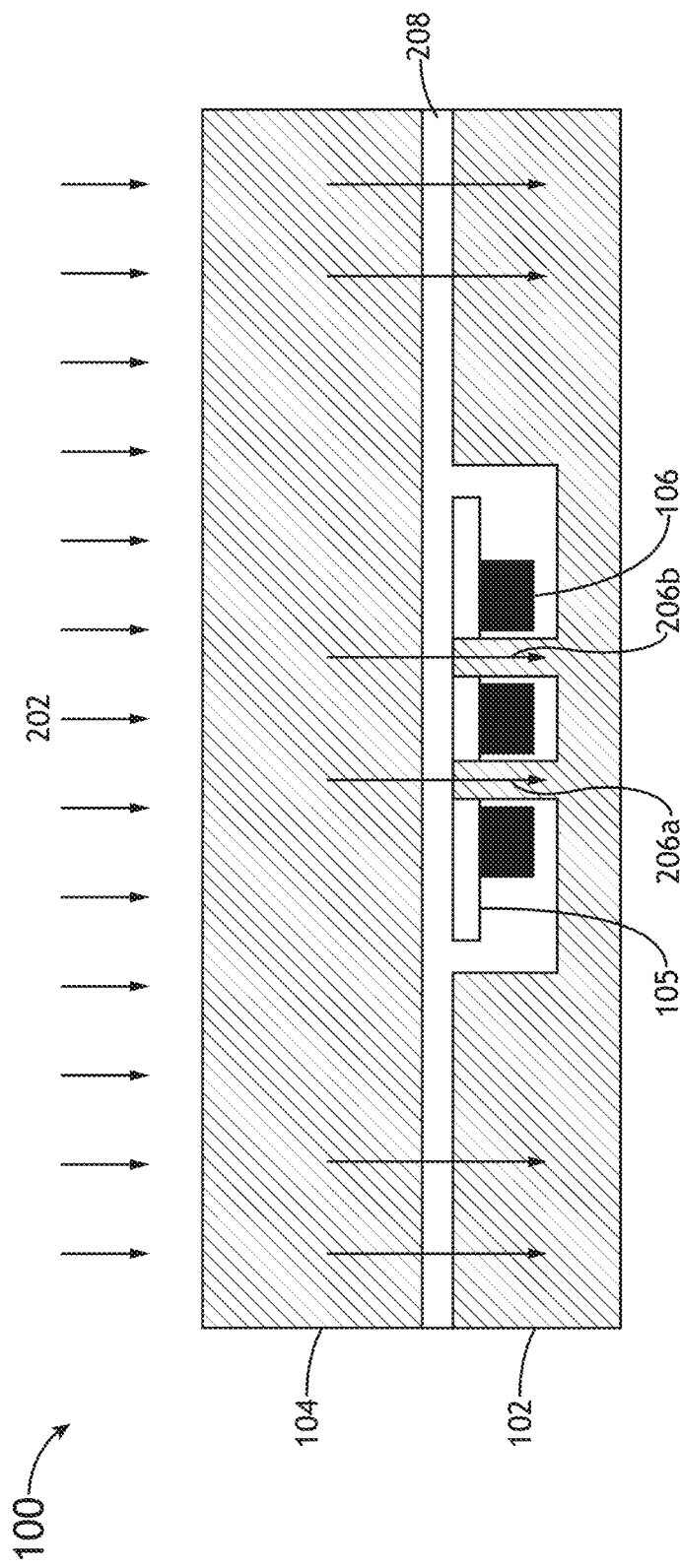
FIG. 2B is a simplified cross-sectional view of a process condition measurement wafer assembly, in accordance with one or more embodiments of the present disclosure.

FIG. 2B is a simplified cross-sectional view of a process condition measurement wafer assembly 100, in accordance with one or more embodiments of the present disclosure.

In some embodiments, the process condition measurement wafer assembly 100 may include one or more thermal pillar structures 206a, 206b configured to facilitate efficient thermal conductivity pathways between at least a portion of the top substrate 104 and at least a portion of the bottom substrate 102. For example, the one or more thermal pillar structures 206a, 206b may be machined into at least one of the top substrate 104 or the bottom substrate 102. By way of another example, the one or more thermal pillar structures 206a, 206b may be metal plated onto at least one of the top substrate 104 or the bottom substrate 102. In embodiments, the one or more printed circuit elements 105 may include one or more ports, holes, or apertures configured to receive the one or more pillar structures 206a, 206b. Accordingly, the one or more pillar structures 206a, 206b may be configured to create efficient thermal conductivity pathways from the top substrate 104 to the bottom substrate 102 through one or more ports (e.g., holes, apertures, or the like) within the printed circuit elements 105. The one or more pillar structures 206a, 206b may be formed from any material known in the art including, but not limited to, semiconductor materials, metal materials, or the like. For example, the one or more pillar structures 106a, 206b may include silicon pillars, conductive metal pillars, and the like.

Figure 3:
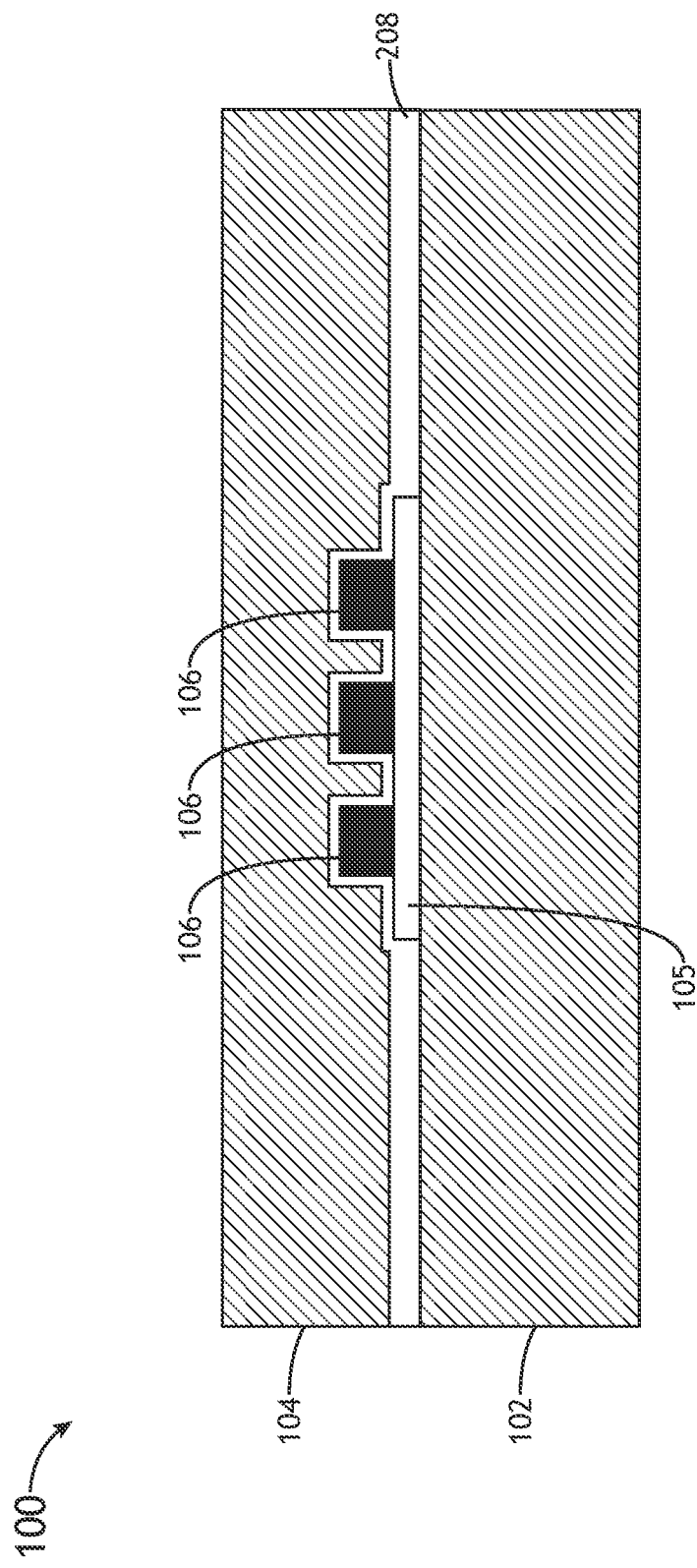
FIG. 3 is a simplified cross-sectional view of a process condition measurement wafer assembly, in accordance with one or more embodiments of the present disclosure.

FIG. 3 is a simplified cross-sectional view of a process condition measurement wafer assembly 100, in accordance with one or more embodiments of the present disclosure. The process condition measurement wafer assembly 100 may include, but is not limited to, a top substrate 104, a bottom substrate 102, one or more electronic components 106, one or more printed circuit elements 105, and one or more layers 208. It is noted herein that the one or more layers 208 may include one or more adhesive layers and/or one or more shielding layers 108 discussed previously herein with respect to FIGS. 1B-1F.

In one embodiment, the one or more printed circuit elements 105 may be coupled to at least one of the top substrate 104 or the bottom substrate 102. For example, the one or more printed circuit elements 105 may be brazed and/or direct bonded to at least one of the top substrate 104 or the bottom substrate 102. For instance, as noted previously herein, an inorganic printed circuit element 105 may be direct bonded to the bottom substrate 102. It is noted herein that direct bonding the one or more printed circuit elements 105 to the top substrate 104 and/or the bottom substrate may improve thermal conductivity and thermal management of the process condition measurement wafer assembly 100.

Figure 4B:
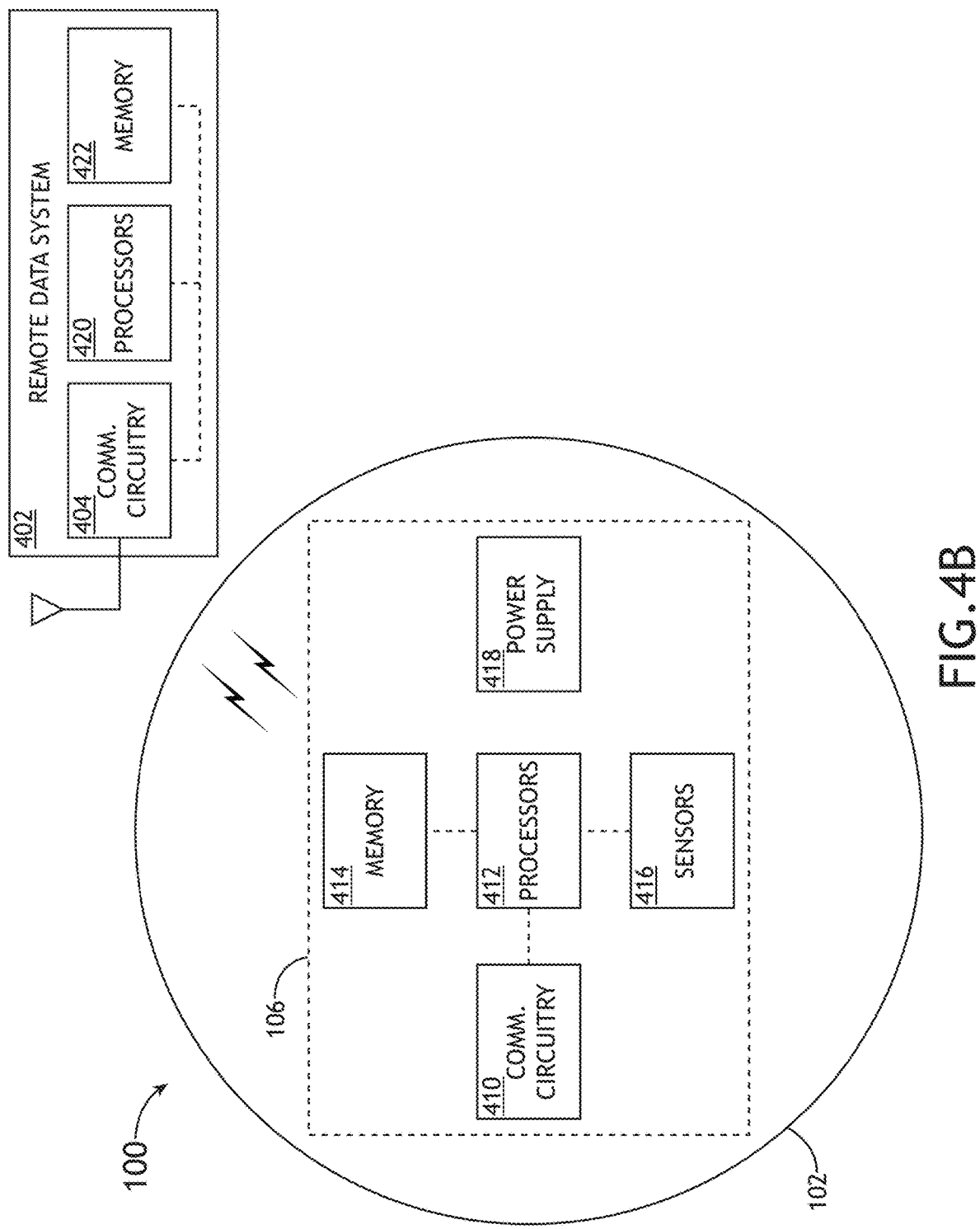
FIG. 4B is a simplified block diagram view of a process condition measurement wafer assembly communicatively coupled to a remote data system, in accordance with one or more embodiments of the present disclosure.

FIG. 4A is a simplified cross-sectional view of a process condition measurement wafer assembly 100 communicatively coupled to a remote data system 402, in accordance with one or more embodiments of the present disclosure. FIG. 4B is a simplified block diagram view of a process condition measurement wafer assembly 100 communicatively coupled to a remote data system 402, in accordance with one or more embodiments of the present disclosure.

In some embodiments, as noted previously herein, the process condition measurement wafer assembly 100 includes one or more electronic components 106, which may include one or more sensors. In another embodiment, one or more electronic components 106 may be disposed at one or more locations across the printed circuit elements 105 and communicatively coupled to one another via one or more wireline and/or wireless connections. The one or more electronic components 106 may include, but are not limited to, communication circuitry 410, one or more processors 412, a memory 414, one or more sensors 416, and a power supply 418. In some embodiments, the power supply 418 may include any power source known in the art including, but not limited to, batteries, wirelessly rechargeable batteries, and the like.

For the purposes of the present disclosure, the term 'processor' may be broadly defined to encompass any device having one or more processors (e.g., CPU) or logic elements (e.g., ASICs), which execute instructions from an internal or external memory 414. In this sense, the one or more processors 412 may include any microprocessor-type or logic device configured to execute algorithms and/or instructions. It should be recognized that the steps described throughout the present disclosure may be carried out by a single processor 412, or, alternatively, multiple processors 412. The memory 414 may include a read-only memory, a random-access memory, a solid-state drive, flash, EPROM, EEPROM, and the like.

In embodiments, the one or more processors 412 are configured to execute a set of program instructions stored in memory 414, the set of program instructions configured to cause the one or more processors 412 to carry out various steps/functions of the present disclosure. For example, the one or more processors 412 may be configured to: generate one or more control signals configured to cause the one or more sensors 416 to acquire one or more measurement parameters; store acquired measurement parameters in memory 414; calculate one or more values based on the one or more measurement parameters; and transmit the one or more measurement parameters and/or the one or more determined values to a remote data system 402 via the communication circuitry 410. Each of these steps will be addressed herein.

In one embodiment, the one or more processors 412 of the process condition measurement wafer assembly 100 are configured to generate one or more control signals configured to cause the one or more sensors 416 to acquire one or more measurement parameters. In this regard, the one or more sensors 416 located at one or more locations within the process condition measurement wafer assembly 100/printed circuit elements 105 may be configured to acquire one or more measurement parameters (e.g., thermocouple voltage, resistance from resistance temperature device, voltage/signal from a pressure sensor, voltage/signal from a radiation sensor, voltage/signal from a chemical sensor, and the like). It is noted herein that the one or more sensors 416 may be configured to acquire measurement parameters associated with any parameter or characteristic which is to be monitored throughout a processing system (e.g., temperature, heat flux, pressure, and the like).

It is noted that the one or more sensors 416 may be formed so as to have any shape and be distributed in any manner across the process condition measurement wafer assembly 100 (e.g., across the bottom substrate 102). In this regard, the one or more sensors 416 may be selectively distributed across the process condition measurement wafer assembly 100 so as to acquire measurement parameters in the selected locations associated with each sensor 416. It is further contemplated herein that the one or more sensors 416 may include discrete sensor devices, and/or may be integrated into the top substrate 104 and/or bottom substrate 102.

It is further noted that the one or more sensors 416 may include any measurement device known in the art. For example, the one or more sensors 416 may include, but are not limited to, a thermal/temperature sensor, a pressure sensor, a radiation sensor, a chemical sensor, a voltage sensor, a heat flux sensor, and the like. For instance, in the case of temperature measurements, the one or more sensors 416 may include, but are not limited to, one or more thermocouple (TC) devices (e.g., thermoelectric junction) or one or more resistance temperature devices (RTDs) (e.g., thin film RTD). In another instance, in the case of pressure measurements, the one or more sensors 416 may include, but are not limited to, a piezoelectric sensor, a capacitive sensor, an optical sensor, a potentiometric sensor and the like. In another instance, in the case of radiation measurements, the one or more sensors 416 may include, but are not limited to, one or more light detectors (e.g., photovoltaic cell, photoresistor and the like) or other radiation detectors (e.g., solid state detector). In another instance, in the case of chemical sensors, the one or more sensors 416 may include, but are not limited to, one or more chemiresistors, gas sensors, pH sensors and the like.

In another embodiment, the one or more processors 412 of the process condition measurement wafer assembly 100 are configured to store acquired measurement parameters in memory 414.

In another embodiment, the one or more processors 412 of the process condition measurement wafer assembly 100 are configured to calculate one or more values based on the one or more acquired measurement parameters. The one or more processors 412 may be configured to calculate any value known in the art based on the acquired measurement parameters. For example, in the case of temperature, the one or more sensors 416 may be configured to acquire thermocouple voltages (measurement parameters) indicative of temperature, and the one or more processors 412 may be configured to calculate a temperature based on the thermocouple voltages.

In another embodiment, the one or more processors 412 of the process condition measurement wafer assembly 100 are configured to transmit the one or more measurement parameters and/or the one or more determined values to a remote data system 402 via the communication circuitry 410. In this regard, the one or more electronic components 106 of the process condition measurement wafer assembly 100 may be communicatively coupled to a remote data system 402 via communication circuitry 410. The one or more electronic components 106 of the process condition measurement wafer assembly 100 may be communicatively coupled to a remote data system 402 using any wireline or wireless communication protocols known in the art.

In embodiments, the one or more electronic components 106 of the process condition measurement wafer assembly 100 may be wirelessly communicatively coupled to the remote data system 402. The one or more electronic components 106 may be wirelessly communicatively coupled to the remote data system 402 in any suitable manner. The communication circuitry 410 may include any communication circuitry and/or communication device known in the art of communication. For instance, the communication circuitry 410 may include, but is not limited to, one or more communication antennas (e.g., communication coil).

In one embodiment, the communication circuitry 410 is configured to establish a communication link between the process condition measurement wafer assembly 100 and the off-substrate remote data system 402. Further, the communication circuitry 410 may be communicatively coupled to the one or more processors 412, memory 414, one or more sensors 416, and power supply 418. In this regard, the one or more processors 412 may be configured to generate one or more control signals configured to cause the communication circuitry 410 to transmit the one or more measurement parameters and/or the one or more determined values to the remote data system 402.

In one embodiment, the remote data system 402 includes communication circuitry 404 suitable for establishing the communication link between the on-substrate communication circuitry 410 and the remote data system 402. For example, the communication circuitry 404 may establish the communication link between the on-substrate communication circuitry 410 and the remote data system 402 using a radio frequency (RF) signal, 3G, 4G, 4G LTE, 5G, WiFi protocols, Bluetooth protocols, and the like.

As discussed previously herein, the one or more processors 412 of the process condition measurement wafer assembly 100 may be configured to determine values associated with the acquired measurement parameters. In additional and/or alternative embodiments, values associated with the acquired measurement parameters may be determined/calculated by one or more processors 420 of the remote data system 402. For example, the communication circuitry 410 may transmit acquired measurement parameters to the remote data system 402, and the one or more processors 420 of the remote data system 402 may calculate one or more values based on the acquired measurement parameters acquired by the sensors 416.

In another embodiment, the remote data system 402 may be configured to map (or correlate) the one or more values calculated by the processors 412 and/or the remote data system 402 based on the one or more measurement parameters acquired by sensors 416. The remote data system 402 may be configured to map (or correlate) the one or more values to the position of acquisition on the process condition measurement wafer assembly 100 (e.g., "measurement locations"). In another embodiment, the remote data system 402 reports the mapped values to a user interface. For example, the remote data system 402 may report mapped values to one or more of a desktop computer, laptop, tablet, handheld device, memory, or a server.

As noted previously herein, some conventional process condition measurement wafers are often subject to temperature inaccuracies attributable to internal construction variation. For example, with conventional process condition measurement wafers, temperature readings (e.g., measurement parameters) may be collected at 65 discreet locations across the wafer. When these acquired temperature readings are displayed in a 2-D map, the temperature of the wafer may be simply interpolated between sensor locations/measurement locations. Depending on the source and magnitude of temperature non-uniformity within the conventional process condition measurement wafers (e.g., chuck temperature, heat flux, wafer cooling) the accuracy of the interpolated temperature may vary, leading to inaccurate temperature measurements.

Accordingly, some embodiments of the present disclosure are directed to a process condition measurement wafer assembly 100 and technique for improving the accuracy of temperature readings by calibrating out conduction variations. This may be further understood with reference to FIG. 5.

Figure 5:
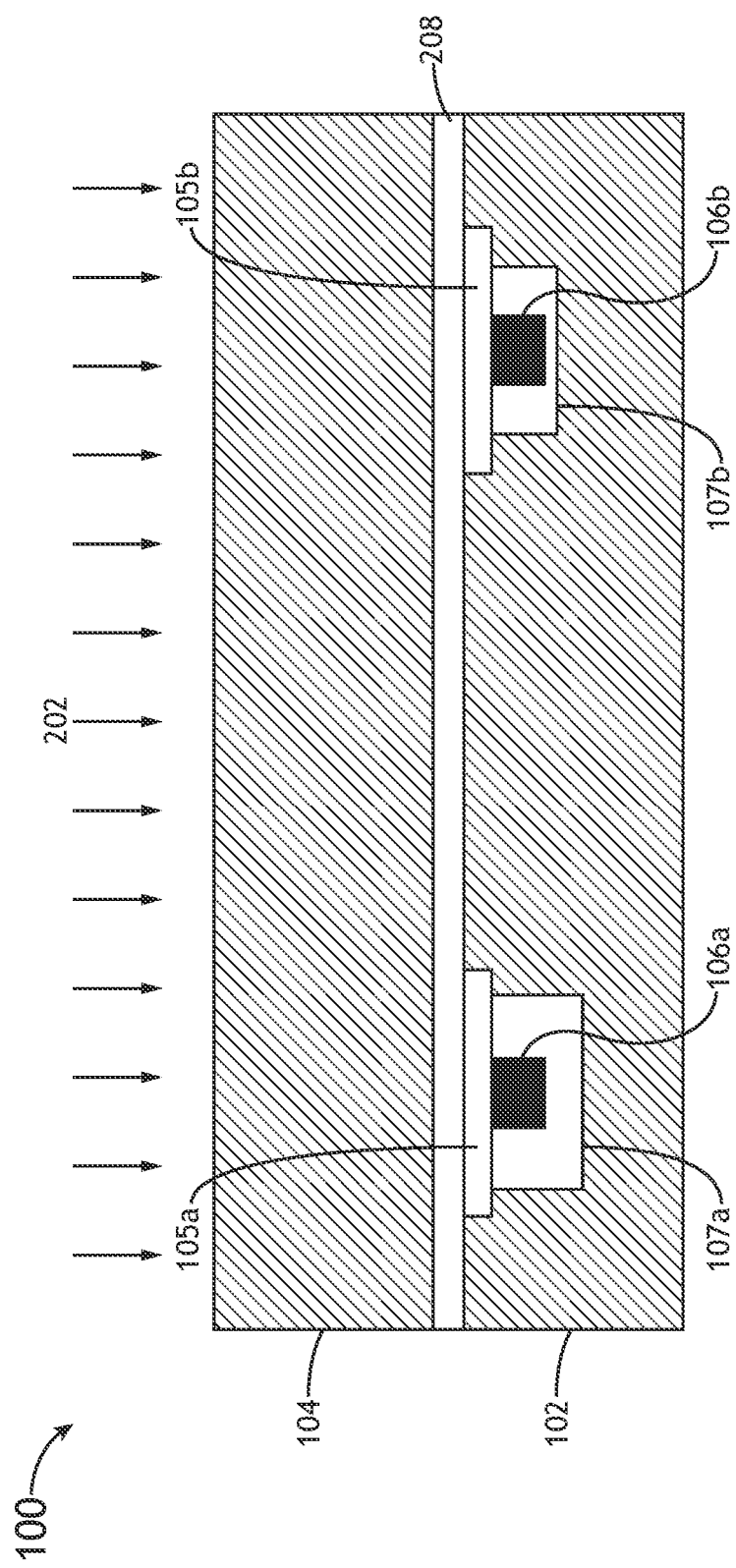
FIG. 5 is a simplified cross-sectional view of a process condition measurement wafer assembly, in accordance with one or more embodiments of the present disclosure.

FIG. 5 is a simplified cross-sectional view of a process condition measurement wafer assembly 100, in accordance with one or more embodiments of the present disclosure.

As shown in FIG. 5, a first electronic component 106a (e.g., first sensor 416a) disposed on a first printed circuit element 105a may be disposed within a first cavity 107a between the top substrate 104 and the bottom substrate 102. Similarly, a second electronic component 106b (e.g., second sensor 416b) disposed on a second printed circuit element 105b may be disposed within a second cavity 107b between the top substrate 104 and the bottom substrate 102. Comparing the relative arrangement of the cavities 107a, 107b and electronic components 106a, 106b, it may be seen that the first cavity 107a is larger than the second cavity 107b. In this regard, the first electronic component 106a is further removed/spaced from the bottom substrate 102, and is therefore further decoupled from the bottom substrate 102 by a larger thermal resistance as compared to the second electronic component 106b.

In a perfect isothermal environment, the first electronic component 106a (e.g., first sensor 416a) and the second electronic component 106a (e.g., second sensor 416b) would acquire identical temperature measurements (e.g., measurement parameters). However, fabrication processes typically are not carried out in perfect isothermal environments. During fabrication processes (e.g., etch processes), the bottom substrate 102 may be cooled while heat flux 202 is applied to the top substrate 102. In this case, the first sensor 416a would read higher than second sensor 416b, as it is further removed from the cooled bottom substrate 102, and therefore more decoupled from cooling.

Thus, it may be seen that construction variations (e.g., varying size of cavities 107a, 107b) may result in errors/discrepancies in acquired measurement parameters. Other construction variations which may result in discrepancies between acquired measurement parameters and/or calculated values may include, but are not limited to, variations in size/shape of electronic components 106, adhesion to varying surfaces (e.g., coupling to top substrate 104, coupling to bottom substrate 102), variations in adhesive and/or conductive properties, and the like. Furthermore, as temperature gradients and heat fluxes 202 become greater, such construction variations may lead to increased discrepancies between acquired measurement parameters and/or calculated values.

Accordingly, some embodiments of the present disclosure are directed to quantifying and calibrating effects of construction variations on acquired measurement parameters and/or calculated values. By quantifying effects of construction variations on acquired measurement parameters, and calibrating out (e.g., removing) determined effects, the system and method of the present disclosure may enable more efficient and accurate process monitoring.

In embodiments, the one or more processors 420 of the remote data system 402 are configured to execute a set of program instructions stored in memory 422, the set of program instructions configured to cause the one or more processors 420 to carry out various steps/functions of the present disclosure. For example, the one or more processors 420 may be configured to: acquire, under isothermal conditions, a set of temperature measurements from a set of temperature sensors and a set of heat flux measurements from a set of heat flux sensors distributed across the process condition measurement wafer assembly 100; calibrate the set of temperature measurements and the set of heat flux measurements acquired under isothermal conditions; apply a known heat flux to the process condition measurement wafer assembly 100; acquire, during application of the known heat flux, an additional set of temperature measurements from the set of temperature sensors and an additional set of heat flux measurements from the set of heat flux sensors; identify temperature variation observed across the set of temperature sensors during application of the known heat flux; identify a heat flux-temperature variation relationship by correlating the known heat flux with the identified temperature variation of the set of temperature sensors; acquire, under unknown heat flux conditions, a test set of temperature measurements from the set of temperature sensors and a test set of heat flux measurements from the heat flux sensors; and adjust the test set of temperature measurements based on the test set of heat flux measurements and the identified heat flux-temperature variation relationship. Each of these steps/functions will be addressed in further detail herein.

In one embodiment, the processors 420 may be configured to acquire, under isothermal conditions, a set of temperature measurements from a set of temperature sensors 416 and a set of heat flux measurements from a set of heat flux sensors 416 distributed across the process condition measurement wafer assembly 100. For example, a process condition measurement wafer assembly 100 may be fabricated to include a plurality of temperature sensors 416 and a plurality of heat flux sensors 416 distributed at varying locations throughout the process condition measurement wafer assembly 100. Under isothermal conditions, the plurality of temperature sensors 416 and the plurality of heat flux sensors 416 may be configured to acquire a set of temperature measurements and heat flux measurements, respectively. The processors 420 may then be configured to receive the acquired measurements via communication circuitry 404, 410.

In another embodiment, the processors 420 may be configured to calibrate the set of temperature measurements and the set of heat flux measurements acquired under isothermal conditions. For example, the processors 420 may be configured to set the measurements acquired under isothermal conditions as a baseline against which subsequent measurements may be compared and/or adjusted.

In another embodiment, the processors 420 may be configured to generate one or more control signals configured to cause a heat source to apply a known heat flux to the process condition measurement wafer assembly 100. For example, in a processing environment, the processors 420 may be communicatively coupled to one or more heat sources (not shown). The processors 420 may be configured to generate one or more control signals configured to cause the one or more heat sources to apply a known heat flux to the process condition measurement wafer assembly 100. Parameters/characteristics associated with known heat fluxes may be stored in memory 422 and retrieved by the processors 420.

In another embodiment, the processors 420 may be configured to acquire, during application of the known heat flux, an additional set of temperature measurements from the set of temperature sensors 416 and an additional set of heat flux measurements from the set of heat flux sensors 416. For example, during application of the known heat flux, the plurality of temperature sensors 416 and the plurality of heat flux sensors 416 may be configured to acquire an additional set of temperature measurements and heat flux measurements, respectively. The processors 420 may then be configured to receive the acquired measurements via communication circuitry 404, 410. The processors 420 may be configured to store the acquired measurements in memory 422.

In another embodiment, the processors 420 may be configured to identify one or more temperature variations observed across the set of temperature sensors 416 during application of the known heat flux. For example, as noted previously herein with respect to FIG. 5, construction variations (e.g., varying size of cavities 107*a*, 107*b*, variations in size/shape of electronic components 106, adhesion to varying surfaces, variations in adhesive and/or conductive properties, and the like) may cause a first temperature sensor 416*a* to acquire varying readings as compared to an additional temperature sensor 416*b*. In this regard, the processors 420 may be configured to identify one or more temperature variations observed across the set of temperature sensors 416 during application of the known heat flux.

In another embodiment, the processors 420 may be configured to identify a heat flux-temperature variation relationship by correlating the known heat flux with the identified temperature variation of the set of temperature sensors 416. For example, the processors 420 may be configured to associate the known heat flux with the identified temperature variation in order to identify the heat flux-temperature variation relationship. It is contemplated herein that the identified heat flux-temperature variation relationship may take any form known in the art including, but not limited to, a relationship represented by a mathematical equation(s), a list of associated heat flux values and related temperature variation values, and the like.

In order to more thoroughly model a heat flux-temperature variation relationship, the processors 420 may be configured to collect readings at multiple isothermal conditions, as well as during a plurality of varying known heat flux conditions. By collecting measurements under these varying conditions, the processors 420 may be configured to generate a model which represents the identified heat flux-temperature variation relationship of the process condition measurement wafer assembly 100.

After identification of the heat flux-temperature variation relationship, the process condition measurement wafer assembly 100 may subsequently be used in one or more processes (e.g., processes within epitaxy chambers, processes within plasma etch chambers). While conditions within the respective chambers may be generally known, the exact temperature and heat flux conditions, as experienced by the process condition measurement wafer assembly 100, may be unknown. Accordingly, the processors 412 may be configured to acquire a test set of temperature measurements and a test set of heat flux measurements from the sensors 416.

For example, under unknown heat flux conditions, the set of temperature sensors 416 may be configured to acquire a test set of temperature measurements, and the set of heat flux sensors 416 may be configured to acquire a test set of heat flux measurements. The processors 420 may then be configured to receive the acquired measurements via communication circuitry 404, 410. The processors 420 may be configured to store the acquired measurements in memory 422.

In another embodiment, the processors 420 may be configured to adjust the test set of temperature measurements based on the test set of heat flux measurements and the identified heat flux-temperature variation relationship. For example, based on the heat flux-temperature variation relationship, the processors 420 may be configured to identify a sub-set of temperature sensors 416 reading higher temperatures under a particular set of heat flux conditions. In this regard, the processors 420 may be configured to adjust (e.g., lower) the temperature measurements of the test set of temperature measurements collected by the sub-set of temperature sensors 416 based on the heat flux-temperature variation relationship. It is noted herein that the processors 420 may be configured to adjust the test set of temperature measurements using any mathematical technique known in the art.

In another embodiment, the processors 420 may be configured to map the adjusted test set of temperature measurements to one or more measurement locations of the process condition measurement wafer assembly 100. For example, the locations of each of the temperature sensors 416 on the process condition measurement wafer assembly 100 may be known and stored in memory 422. These known locations of temperature sensors 416 are locations in which temperature measurements are acquired by the process condition measurement wafer assembly 100, and may be referred to as measurement locations. In this regard, the processors 420 may be configured to map the adjusted test set of temperature measurements to the respective known locations of each temperature sensor 416 (e.g., measurement locations).

In another embodiment, the processors 420 may be configured to interpolate a set of temperature values at locations between the one or more measurement locations based on the adjusted test set of temperature measurements and one or more interpolation functions. For example, the processors 420 may be configured to map a first adjusted temperature value to a first measurement location and a second adjusted temperature value to a second measurement location. In this example, the processors 420 may be configured to interpolate between the first measurement location and the second measurement location. For instance, the processors 420 may be configured to assign one or more temperature values to one or more locations between the first measurement location and the second measurement location.

Depending on the source and magnitude of temperature non-uniformity between various measurement locations, the accuracy of interpolated temperature values may vary. In order to improve the accuracy of the interpolated temperature values between temperature sensors 416 (e.g., between measurement locations), the processors 420 may be configured to model the effects of different types of construction variation/non-uniformity (e.g., varying size of cavities 107a, 107b, variations in size/shape of electronic components 106, adhesion to varying surfaces, variations in adhesive and/or conductive properties, and the like) on acquired temperature values. For example, known construction variations/non-uniformities may be considered and included in the heat flux-temperature variation relationship discussed above. In this regard, the processors 420 may be configured to account for construction variations within the process condition measurement wafer assembly 100 when generating the heat flux-temperature variation relationship model.

After accounting for construction variations in the heat flux-temperature variation relationship model, the process condition measurement wafer assembly 100 may be used in a chamber to be tested. Subsequently, process non-uniformities may be identified by a number of techniques including, but not limited to: measurement of pre-plasma chuck non-uniformity, steady state temperature data (e.g., temperature measurements from temperature sensors 416), determining a derivative of temperature measurements over time (dT/dt) to estimate heat flux and cooling non-uniformity, concurrent acquisition of temperature measurements with heat flux measurements, and the like. In some embodiments, the processors 420 may be configured to utilize known effects of construction variation (e.g., heat flux-temperature variation relationship model based at least partially on construction variations) and identified process non-uniformities to more accurately predict process temperature values between measurement locations (e.g., between temperature sensors 416).

In additional and/or alternative embodiments, measurement parameters and/or values acquired by the process condition measurement wafer assembly 100 may be used in a feedforward or feedback loop in order to adjust one or more upstream or downstream process tools. For example, upon acquiring measurement parameters in a semiconductor device process, the one or more processors 420 may be configured to receive the acquired measurement parameters and/or determined values, and generate one or more control signals configured to selectively adjust one or more characteristics of one or more process tools within the semiconductor device process. Process tools which may be adjusted may include, but are not limited to, lithography tools, deposition tools, etching tools, and the like.

It is noted herein that the one or more components of the process condition measurement wafer assembly 100 and associated system may be communicatively coupled to the various other components of the process condition measurement wafer assembly 100 and associated system in any manner known in the art. For example, the communication circuitry 410, 404 may be communicatively coupled to each other and other components via a wireline (e.g., copper wire, fiber optic cable, and the like) or wireless connection (e.g., RF coupling, IR coupling, 3G, 4G, 4G LTE, 5G, WiFi, WiMax, Bluetooth and the like).

In one embodiment, the one or more processors 412, 420 may include any one or more processing elements known in the art. In this sense, the one or more processors 412, 420 may include any microprocessor-type device configured to execute software algorithms and/or instructions. In one embodiment, the one or more processors 412, 420 may consist of a desktop computer, mainframe computer system, workstation, image computer, parallel processor, or other computer system (e.g., networked computer) configured to execute a program configured to operate the process condition measurement wafer assembly 100 and associated system, as described throughout the present disclosure. It should be recognized that the steps described throughout the present disclosure may be carried out by a single computer system or, alternatively, multiple computer systems. Furthermore, it should be recognized that the steps described throughout the present disclosure may be carried out on any one or more of the one or more processors 412, 420. In general, the term "processor" may be broadly defined to encompass any device having one or more processing elements, which execute program instructions from memory 414, 422. Moreover, different subsystems of the process condition measurement wafer assembly 100 and associated system (e.g., sensors 416, remote data system 402) may include processor or logic elements suitable for carrying out at least a portion of the steps described throughout the present disclosure. Therefore, the above description should not be interpreted as a limitation on the present disclosure but merely an illustration.

The memory 414, 422 may include any storage medium known in the art suitable for storing program instructions executable by the associated one or more processors 412, 420 and the data received from the process condition measurement wafer assembly 100/sensors 416. For example, the memory 414, 422 may include a non-transitory memory medium. For instance, the memory 414, 422, may include, but is not limited to, a read-only memory (ROM), a random-access memory (RAM), a magnetic or optical memory device (e.g., disk), a magnetic tape, a solid-state drive and the like. It is further noted that the memory 414, 422 may be housed in a common controller housing with the one or more processors 412, 420. In an alternative embodiment, the memory 414, 422 may be located remotely with respect to the physical location of the processors 412, 420. In another embodiment, the memory 414, 422 maintains program instructions for causing the one or more processors 412, 420 to carry out the various steps described through the present disclosure.

Figure 6:
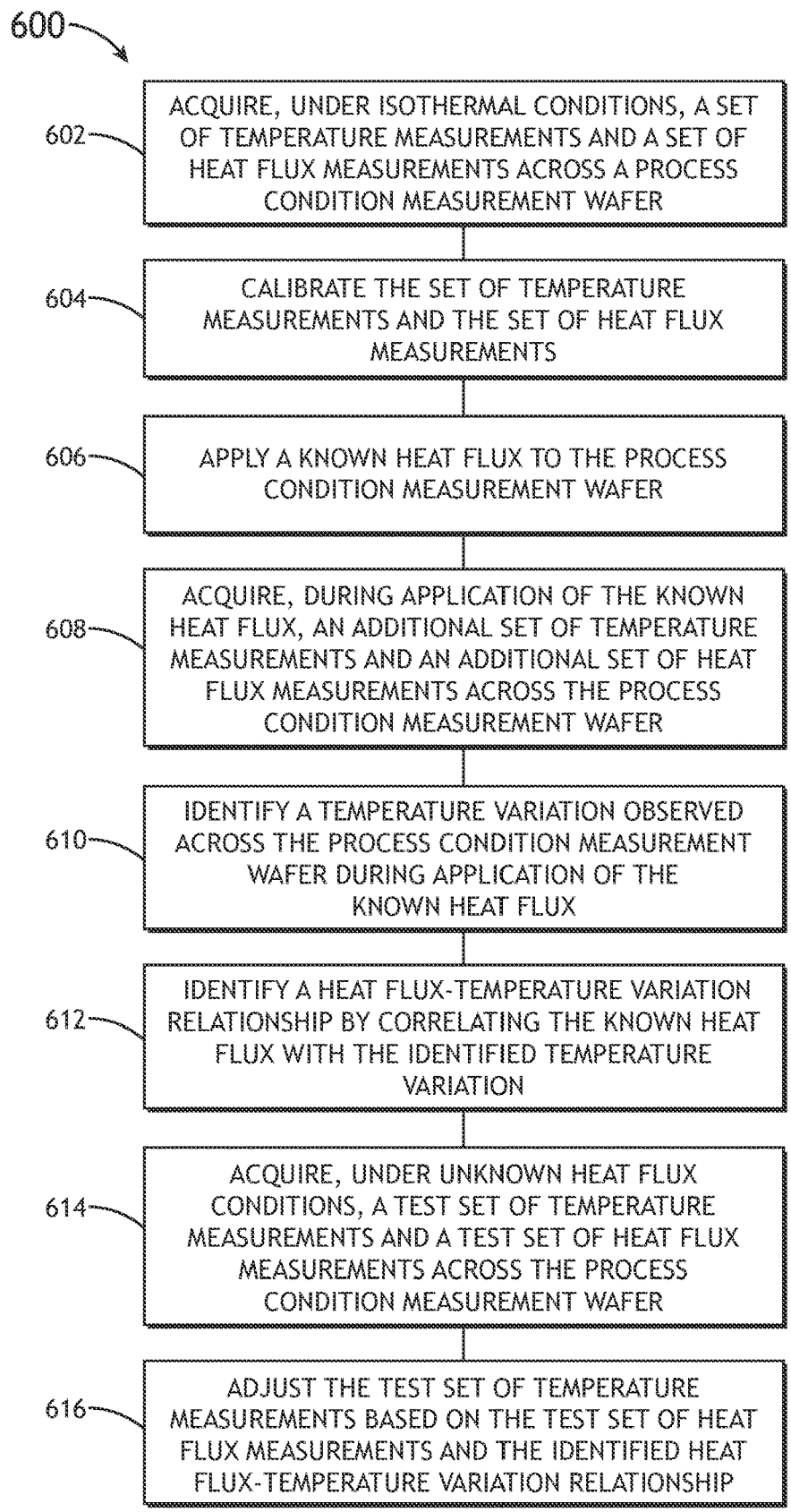
FIG. 6 is a flowchart of a method for calculating temperatures across a process condition measurement wafer assembly, in accordance with one or more embodiments of the present disclosure.

FIG. 6 is a flowchart of a method 600 for calculating temperatures across a process condition measurement wafer assembly 100, in accordance with one or more embodiments of the present disclosure.

In a step 602, a set of temperature measurements from a set of temperature sensors and a set of heat flux measurements are acquired under isothermal conditions from a set of heat flux sensors distributed across a process condition measurement wafer. For example, a process condition measurement wafer assembly 100 may be fabricated to include a plurality of temperature sensors 416 and a plurality of heat flux sensors 416 distributed at varying locations throughout the process condition measurement wafer assembly 100. Under isothermal conditions, the plurality of temperature sensors 416 and the plurality of heat flux sensors 416 may be configured to acquire a set of temperature measurements and heat flux measurements, respectively. The processors 420 may then be configured to receive the acquired measurements via communication circuitry 404, 410.

In a step 604, the set of temperature measurements and the set of heat flux measurements acquired under isothermal conditions are calibrated. For example, the processors 420 may be configured to calibrate the set of temperature measurements by adjusting one or more of the acquired temperature measurements. By way of another example, the processors 420 may be configured to set the measurements acquired under isothermal conditions as a baseline against which subsequent measurements may be compared and/or adjusted.

In a step 606, known heat flux is applied to the process condition measurement wafer. For example, in a processing environment, the processors 420 may be communicatively coupled to one or more heat sources (not shown). The processors 420 may be configured to generate one or more control signals configured to cause the one or more heat sources to apply a known heat flux to the process condition measurement wafer assembly 100.

In a step 608, during application of the known heat flux, an additional set of temperature measurements are acquired from the set of temperature sensors and an additional set of heat flux measurements are acquired from the set of heat flux sensors. For example, during application of the known heat flux, the plurality of temperature sensors 416 and the plurality of heat flux sensors 416 may be configured to acquire an additional set of temperature measurements and heat flux measurements, respectively. The processors 420 may then be configured to receive the acquired measurements via communication circuitry 404, 410. The processors 420 may be configured to store the acquired measurements in memory 422.

In a step 610, a temperature variation observed across the set of temperature sensors during application of the known heat flux is identified. For example, as noted previously herein with respect to FIG. 5, construction variations (e.g., varying size of cavities 107a, 107b, variations in size/shape of electronic components 106, adhesion to varying surfaces, variations in adhesive and/or conductive properties, and the like) may cause a first temperature sensor 416a to acquire varying readings as compared to an additional temperature sensor 416b. In this regard, the processors 420 may be configured to identify one or more temperature variations observed across the set of temperature sensors 416 during application of the known heat flux.

In a step 612, a heat flux-temperature variation relationship is identified by correlating the known heat flux with the identified temperature variation of the set of temperature sensors. For example, the processors 420 may be configured to associate the known heat flux with the identified temperature variation in order to identify the heat flux-temperature variation relationship. It is contemplated herein that the identified heat flux-temperature variation relationship may take any form known in the art including, but not limited to, a relationship represented by a mathematical equation(s), a list of associated heat flux values and related temperature variation values, and the like.

In a step 614, under unknown heat flux conditions, a test set of temperature measurements is acquired from the set of temperature sensors, and a test set of heat flux measurements is acquired from the heat flux sensors. For example, under unknown heat flux conditions, the set of temperature sensors 416 may be configured to acquire a test set of temperature measurements, and the set of heat flux sensors 416 may be configured to acquire a test set of heat flux measurements. The processors 420 may then be configured to receive the acquired measurements via communication circuitry 404, 410. The processors 420 may be configured to store the acquired measurements in memory 422.

In a step 616, the test set of temperature measurements is adjusted based on the test set of heat flux measurements and the identified heat flux-temperature variation relationship. For example, based on the heat flux-temperature variation relationship, the processors 420 may be configured to identify a sub-set of temperature sensors 416 reading higher temperatures under a particular set of heat flux conditions. In this regard, the processors 420 may be configured to adjust (e.g., lower) the temperature measurements of the test set of temperature measurements collected by the sub-set of temperature sensors 416 based on the heat flux-temperature variation relationship. It is noted herein that the processors 420 may be configured to adjust the test set of temperature measurements using any mathematical technique known in the art.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

As used herein, directional terms such as "top," "bottom," "over," "under," "upper," "upward," "lower," "down," "downward," and similar terms, are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically interactable and/or physically interacting components and/or wirelessly interactable and/or wirelessly interacting components and/or logically interactable and/or logically interacting components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A method comprising:
   acquiring, under isothermal conditions, a set of temperature measurements from a set of temperature sensors and a set of heat flux measurements from a set of heat flux sensors distributed across a process condition measurement wafer;

calibrating the set of temperature measurements and the set of heat flux measurements acquired under the isothermal conditions;

applying a known heat flux to the process condition measurement wafer;

acquiring, during application of the known heat flux, an additional set of temperature measurements from the set of temperature sensors and an additional set of heat flux measurements from the set of heat flux sensors;

identifying temperature variation observed across the set of temperature sensors during the application of the known heat flux;

identifying a heat flux-temperature variation relationship by correlating the known heat flux with the identified temperature variation of the set of temperature sensors;

acquiring, under unknown heat flux conditions, a test set of temperature measurements from the set of temperature sensors and a test set of heat flux measurements from the heat flux sensors; and adjusting the test set of temperature measurements based on the test set of heat flux measurements and the identified heat flux-temperature variation relationship.

2. The method of claim 1, wherein the set of temperature sensors are distributed across the process condition measurement wafer and the set of heat flux sensors are distributed across the process condition measurement wafer.

3. The method of claim 1, further comprising:
mapping the adjusted test set of temperature measurements to one or more measurement locations of the process condition measurement wafer.

4. The method of claim 3, further comprising:
interpolating a set of temperature values at locations between the one or more measurement locations based on the adjusted test set of temperature measurements and one or more interpolation functions.

5. The method of claim 1, wherein the calibrating the set of temperature measurements and the set of heat flux measurements acquired under the isothermal conditions comprises:
setting the set of temperature measurements and the set of heat flux measurements acquired under the isothermal conditions as a baseline.

6. The method of claim 1, wherein the applying the known heat flux to the process condition measurement wafer comprises:
causing a heat source to apply the known heat flux to the process condition measurement wafer.

7. A system comprising:
one or more processors communicatively couplable to a set of temperature sensors and a set of heat flux sensors of a process measurement condition wafer, wherein the one or more processors are configured to execute a set of program instructions configured to cause the one or more processors to:
acquire, under isothermal conditions, a set of temperature measurements from the set of temperature sensors and a set of heat flux measurements;
calibrate the set of temperature measurements and the set of heat flux measurements acquired under the isothermal conditions;
acquire, during application of a known heat flux, an additional set of temperature measurements from the set of temperature sensors and an additional set of heat flux measurements from the set of heat flux sensors;
identify temperature variation across the set of temperature sensors during the application of the known heat flux;
identify a heat flux-temperature variation relationship by correlating the known heat flux with the identified temperature variation of the set of temperature sensors;
acquire, under unknown heat flux conditions, a test set of temperature measurements from the set of temperature sensors and a test set of heat flux measurements from the heat flux sensors; and
adjust the test set of temperature measurements based on the test set of heat flux measurements and the identified heat flux-temperature variation relationship.

8. The system of claim 7, wherein the set of temperature sensors are distributed across the process condition measurement wafer and the set of heat flux sensors are distributed across the process condition measurement wafer.

9. The system of claim 7, wherein the one or more processors are configured to:
map the adjusted test set of temperature measurements to one or more measurement locations of the process condition measurement wafer.

10. The system of claim 9, wherein the one or more processors are configured to:
interpolate a set of temperature values at locations between the one or more measurement locations based on the adjusted test set of temperature measurements and one or more interpolation functions.

11. The system of claim 7, wherein the calibrating the set of temperature measurements and the set of heat flux measurements acquired under the isothermal conditions comprises:
setting the set of temperature measurements and the set of heat flux measurements acquired under the isothermal conditions as a baseline.

12. The system of claim 7, further comprising:
a heat source configured to apply the known heat flux to the process condition measurement wafer.

13. A system comprising:
a process condition measure wafer, wherein the process condition measurement wafer includes a set of temperature sensors and a set of heat flux sensors; and
one or more processors communicative coupled to the set of temperature sensors and the set of heat flux sensors, wherein the one or more processors are configured to execute a set of program instructions configured to cause the one or more processors to:
acquire, under isothermal conditions, a set of temperature measurements from the set of temperature sensors and a set of heat flux measurements;
calibrate the set of temperature measurements and the set of heat flux measurements acquired under the isothermal conditions;
acquire, during application of a known heat flux, an additional set of temperature measurements from the set of temperature sensors and an additional set of heat flux measurements from the set of heat flux sensors;
identify temperature variation across the set of temperature sensors during the application of the known heat flux;

identify a heat flux-temperature variation relationship by correlating the known heat flux with the identified temperature variation of the set of temperature sensors;

acquire, under unknown heat flux conditions, a test set of temperature measurements from the set of temperature sensors and a test set of heat flux measurements from the heat flux sensors; and adjust the test set of temperature measurements based on the test set of heat flux measurements and the identified heat flux-temperature variation relationship.

14. The system of claim 13, wherein the set of temperature sensors are distributed across the process condition measurement wafer and the set of heat flux sensors are distributed across the process condition measurement wafer.

15. The system of claim 13, wherein the one or more processors are configured to:

map the adjusted test set of temperature measurements to one or more measurement locations of the process condition measurement wafer.

16. The system of claim 15, wherein the one or more processors are configured to:

interpolate a set of temperature values at locations between the one or more measurement locations based on the adjusted test set of temperature measurements and one or more interpolation functions.

17. The system of claim 13, wherein the calibrating the set of temperature measurements and the set of heat flux measurements acquired under the isothermal conditions comprises:

setting the set of temperature measurements and the set of heat flux measurements acquired under isothermal conditions as a baseline.

18. The system of claim 13, further comprising:

a heat source configured to apply the known heat flux to the process condition measurement wafer.

* * * * *